(12) United States Patent
Takahashi et al.

(10) Patent No.: US 6,266,119 B1
(45) Date of Patent: Jul. 24, 2001

(54) LIQUID CRYSTAL APPARATUS AND PRODUCTION PROCESS THEREOF

(75) Inventors: Masanori Takahashi, Chigasaki; Hiroshi Takabayashi, Atsugi; Hideo Mori; Toshimichi Ouchi, both of Yokohama, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/228,409

(22) Filed: Jan. 12, 1999

(30) Foreign Application Priority Data

Jan. 13, 1998 (JP) .................................................. 10-005164

(51) Int. Cl.$^7$ ................................................. G02F 1/1345
(52) U.S. Cl. ............................................ 349/149; 349/151
(58) Field of Search ..................................... 349/149, 151

(56) References Cited

U.S. PATENT DOCUMENTS

| | | | |
|---|---|---|---|
| 5,729,315 | 3/1998 | Takahashi et al. | 349/149 |
| 5,739,887 | * 4/1998 | Ueda et al. | 349/149 |
| 5,847,796 | * 12/1998 | Uchiyama et al. | 349/151 |
| 6,025,901 | * 2/2000 | Adachi et al. | 349/151 |
| 6,091,475 | * 7/2000 | Ogino | 349/151 |

* cited by examiner

Primary Examiner—James A. Dudek
(74) Attorney, Agent, or Firm—Fitzpatrick, Cella, Harper & Scinto

(57) ABSTRACT

A liquid crystal apparatus is constituted by a liquid crystal device including a pair of substrates at least one of which is provided with first electrodes, and a liquid crystal disposed between the substrates; a plurality of driver devices disposed on said at least one substrate at a periphery thereof and electrically connected to the first electrodes; a driver board for supplying signals to the driver devices, disposed in parallel with the driver devices; second electrodes disposed on said at least one substrate and electrically connected to the driver devices; and a plurality of connection sheets disposed between the driver board and said at least one substrate and each electrically connecting each of the driver devices to the driver board via the second electrodes. In the apparatus, the first electrodes are supplied with driving signals for driving the liquid crystal device via the driver board, the connection sheets, the second electrodes and the driver devices, thus ensuring electrical connection of electrodes formed on the driver board with the second electrodes connected to the driver devices.

7 Claims, 7 Drawing Sheets

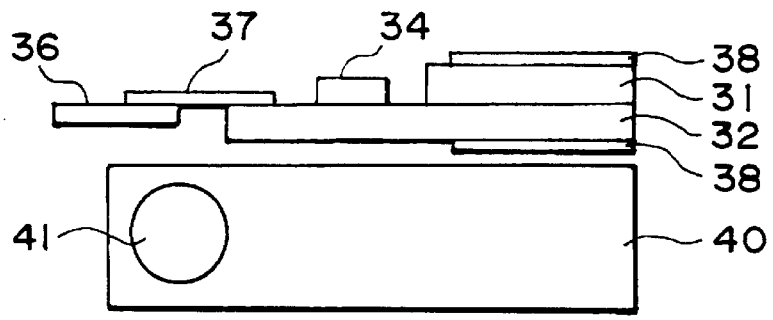
F I G. 5A
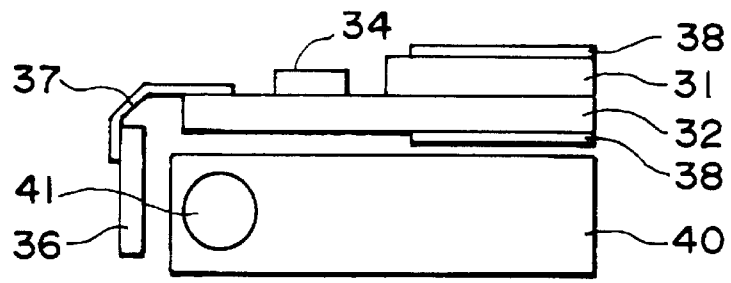
F I G. 5B
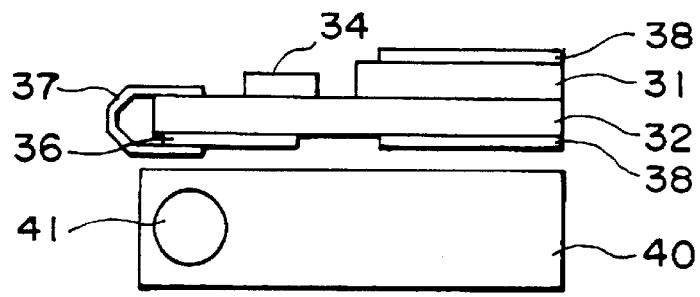
F I G. 5C
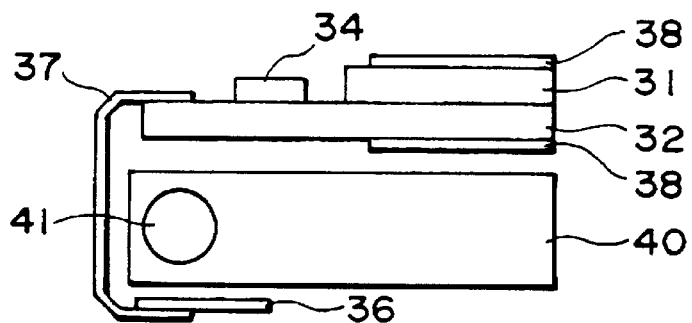
F I G. 5D

LIQUID CRYSTAL APPARATUS AND PRODUCTION PROCESS THEREOF

FIELD OF THE INVENTION AND RELATED ART

The present invention relates to a liquid crystal apparatus including a liquid crystal device provided with drive devices and a process for producing the liquid crystal apparatus.

There have hitherto been utilized liquid crystal apparatus for displaying various data or information by the use of a liquid crystal in various fields.

FIG. 1 shows a schematic plan view of an embodiment of a structure of such a conventional liquid crystal apparatus.

Referring to FIG. 1, a liquid crystal apparatus 1 comprises a liquid crystal panel P1 including a pair of glass substrates 2 and 3 disposed opposite to each other with a gap and a liquid crystal (not shown) sandwiched between these glass substrates 2 and 3. On the (inner) surfaces of the substrates 2 and 3, data electrodes 5 and scanning electrodes 6 are formed, respectively (as partially shown in FIG. 1).

At a periphery of the liquid crystal panel P1, (peripheral) print-circuit boards or driver boards (hereinafter, simply referred to as "PCB(s)") 7, 8 and 9 are disposed and connected to the electrodes 5 and 6 on the liquid crystal panel side via a plurality of tape carrier packages (referred to as "TCP(s)") 10.

FIG. 2 is an enlarged plan view of an embodiment of the TCP 10.

As shown in FIG. 2, the TCP 10 includes a flexible film 10a of, e.g., polyimide and a driver IC (integrated circuit) 10b mounted on the flexible film 10a by the tape automated bonding (TAB). On the flexible film 10a, a plurality of output leads 10c are formed from the driver IC 10b to a side (edge) of the flexible film 10a (as partially shown in FIG. 2) and are electrically connected to the liquid crystal panel-side electrodes 5 and 6 (not shown). Similarly, a plurality of input leads 10d are formed from the driver IC 10b to an opposite side of the flexible film 10a to be connected to the PCBs 7, 8 and 9.

However, in the case where an external force is exerted on the above-mentioned TCP 10 including the driver IC 10b being rigid mounted on the flexible sheet 10a, stress concentration is liable to occur at an electrode-connecting portion of the driver IC 10b. As a result, the TCP 10 is required to adopt various means in order to obviate the stress concentration.

For that purpose, there has been proposed a liquid crystal apparatus 20 having a structure as shown in FIG. 3.

Referring to FIG. 3, in the liquid crystal apparatus 20, driver ICs 21 are directly attached to (mounted on) a glass substrate 22 without using the above-mentioned and a PCB (driver board) 23 is also directly connected to the glass substrate 22 with, e.g., an anisotropic conductive adhesive. More specifically, many electrodes (panel-side electrodes) 21a are formed with a certain pitch at a periphery of the glass substrate 22 between the driver ICs 21 and the PCB 23. On the other hand, on the PCB 23, many electrodes (board-side electrodes) 23a are formed with an identical pitch (to that of the panel-side electrodes 21a) so that respective opposite electrodes 21a and 23a are electrically connected to each other between the glass substrate 22 (or the driver ICs 21) and the PCB 23.

According to this liquid crystal apparatus 20, the driver ICs 21 are attached to the glass substrate 22 which is not readily deformed, so that it becomes possible to alleviate the above-described stress concentration at an electrode-connecting portion of the driver ICs 21.

However, in the case of the liquid crystal apparatus 20, when positions of the board-side electrodes 23a are deviated from normal positions therefor and a degree (amount) of the positional deviation is larger than a width of the panel-side electrodes 21a, electrical connection between the board-side electrodes 23a and the panel-side electrodes 21a cannot be ensured. For this reason, the PCB 23 (driver board) of the liquid crystal apparatus 20 is required to be controlled in terms of a positional error during its production and a position of attachment so that the degree of the positional deviation of the board-side electrodes 23a is smaller than an electrode width of the panel-side electrodes 21a.

In that regard, however, with a longer PCB 23, a degree of a (positional) production error becomes larger, thus requiring a sufficient control of the attachment position of the PCB 23 in order to ensure an electrical connection between the board-side electrodes 23a and the panel-side electrodes 21a. As a result, there arises a problem of a lowering in production yields. Further, when the length of the PCB 23 is further longer, the positional deviation degree of the board-side electrodes 23a exceeds the electrode width of the panel-side electrodes 21a, thus resulting in a failure of production. Particularly, a liquid crystal panel in recent years tends to become a larger size (have a larger picture area), thus leading to a longer PCB 23. As a result, the above-mentioned problem becomes noticeable.

For example, when a flexible printed circuit (FPC) board (referred to as "FPC") is liable to cause a dimensional change of its base film due to, e.g., heat treatment during the production of the FPC, thus resulting in a dimensional error (tolerance) a to a dimensional accuracy of an electrode pattern. The dimensional error of the electrode pattern on the FPC s larger than that on the glass substrate 22 and is generally ca. ±0.1%. Even when the dimensional error is decreased by finely adjusting a size of a mask used in the electrode pattern formation, the resultant dimensional error is ca. ±0.05%.

When the FPC providing a dimensional error of ca. ±0.1% is used as the PCB in combination with a liquid crystal panel having a display area of 17 in., the FPC has a length of ca. 340 mm, thus causing a dimensional error of ca. ±0.34 mm as a maximum error. In this case, if a positional alignment is effected on the basis of a central electrode of the FPC, both terminal-side electrodes are (positionally) deviated by ca. 0.17 mm (a half of the dimensional error).

On the other hand, the panel-side electrodes 21a generally have a width of 0.15–0.2 mm, so that it is theoretically possible to ensure an electrical connection between the panel-side electrodes 21a and the (FPC) board-side electrodes 23a but is difficult to perform the positional alignment, thus lowering a production yield. In the case where the width of the panel-side electrodes 21a is below 0.17 mm, even the production of the liquid crystal apparatus becomes impossible.

This problem becomes more noticeable when a dissolution of the liquid crystal panel is increased or motion picture images are displayed since electrodes employed are required to be arranged in a smaller pitch to increase the number thereof.

SUMMARY OF THE INVENTION

An object of the present invention is to provide a liquid crystal apparatus capable of ensuring an electrical connection between a liquid crystal device and a PCB.

Another object of the present invention is to provide a liquid crystal apparatus capable of preventing a lowering in production yield.

A further object of the present invention is to provide a process for producing the liquid crystal apparatus.

According to the present invention, there is provided a liquid crystal apparatus, comprising:

- a liquid crystal device including a pair of substrates at least one of which is provided with first electrodes, and a liquid crystal disposed between the substrates,
- a plurality of driver devices disposed on the at least one substrate at a periphery thereof and electrically connected to the first electrodes,
- a driver board for supplying signals to the driver devices, disposed in parallel with the driver devices,
- second electrodes disposed on the at least one substrate and electrically connected to the driver devices, and
- a plurality of connection sheets disposed between the driver board and the at least one substrate and each electrically connecting each of the driver devices to the driver board via the second electrodes, whereby
    the first electrodes are supplied with driving signals for driving the liquid crystal device via the driver board, the connection sheets, the second electrodes and the driver devices.

According to the present invention, there is also provided a process for producing a liquid crystal apparatus, comprising: a liquid crystal device including a pair of substrates at least one of which is provided with first electrodes, and a liquid crystal disposed between the substrates; a plurality of driver devices disposed on the at least one substrate at a periphery thereof and electrically connected to the first electrodes; a driver board, provided with electrodes, disposed in parallel with the driver devices; and a plurality of connection sheets, each provided with electrodes, disposed between the driver board and the at least one substrate; the process comprising the steps of:

- forming a plurality of second electrodes on the at least one substrate so as to be electrically connected to the plurality of driver devices,
- positionally aligning the driver board with the at least one substrate so that the electrodes of the driver board and the second electrodes of the at least one substrate are in an opposed relationship,
- electrically connecting each of the electrodes of each of the connection sheets to a corresponding electrode opposite thereto of the driver board, and
- electrically connecting each of the electrodes of each of the connection sheets to a corresponding electrode opposite thereto of the second electrodes, thereby to ensure electrical connection between each of the driver devices and the driver board via the second electrodes and the connection sheets.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 5A–5D are schematic sectional views showing embodiments of a cross-sectional structure of the liquid crystal apparatus of the present invention, respectively.

DETAILED DESCRIPTION OF THE PREFERRED EMBODIMENTS

Hereinbelow, some preferred embodiments of the liquid crystal apparatus according to the present invention will be described with reference to FIGS. 4–9.

Figure 1:
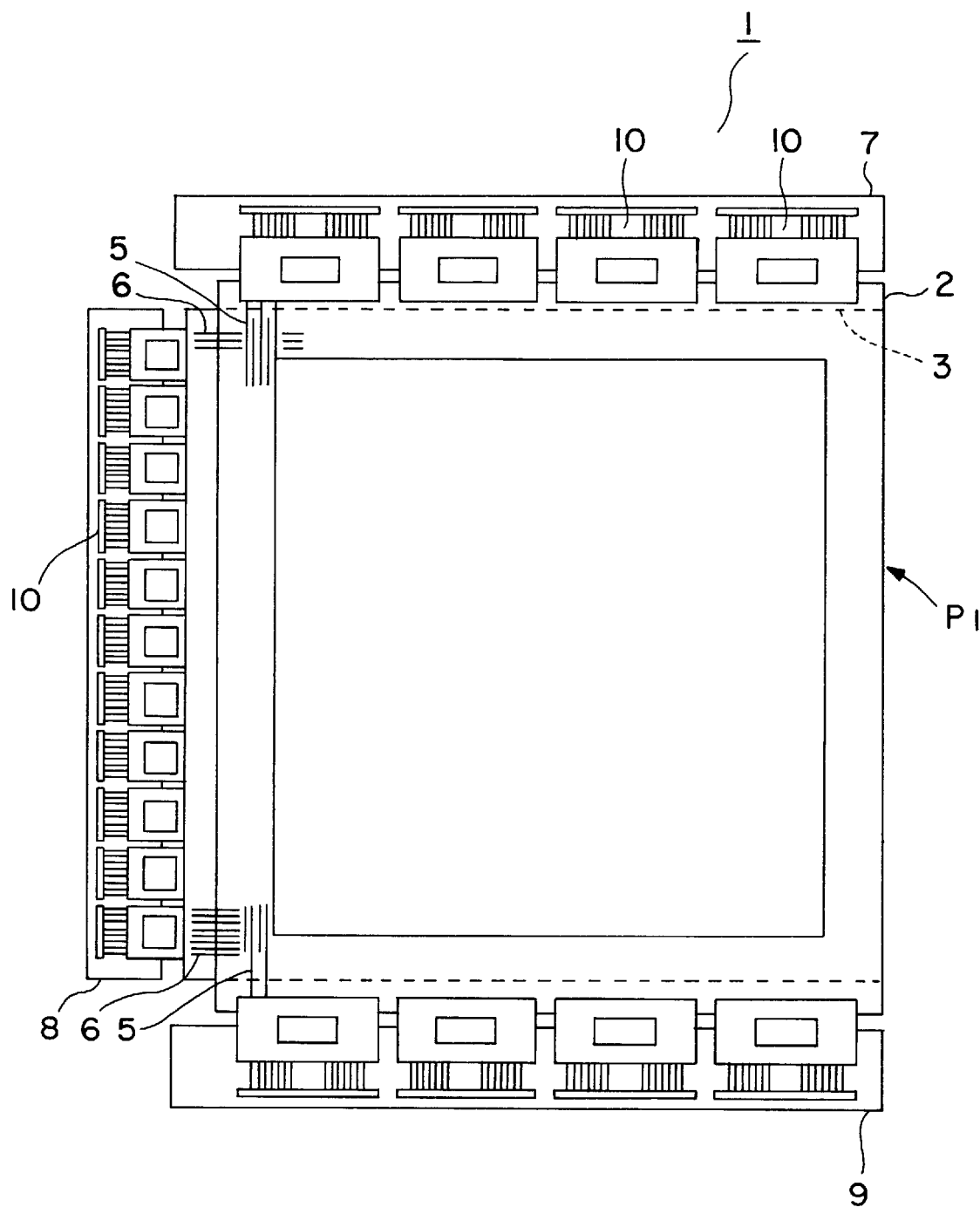
FIGS. 1 and 3 are respectively a schematic plan view of an embodiment of a conventional structure of a liquid crystal apparatus.
Figure 2:
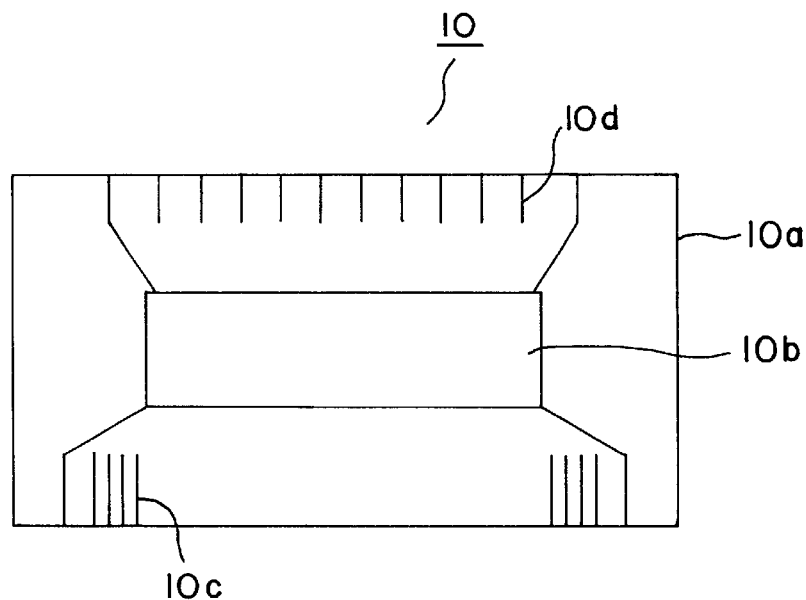
FIG. 2 is an enlarged view of a TCP used in the conventional liquid crystal apparatus shown in FIG. 1.
Figure 3:
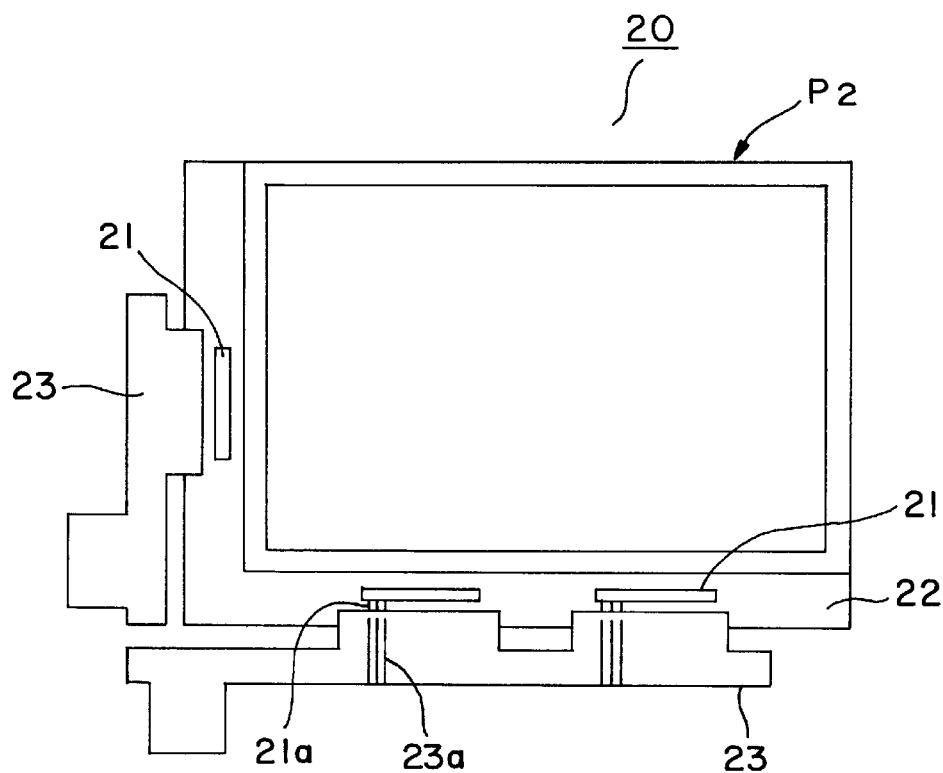
Figure 4:
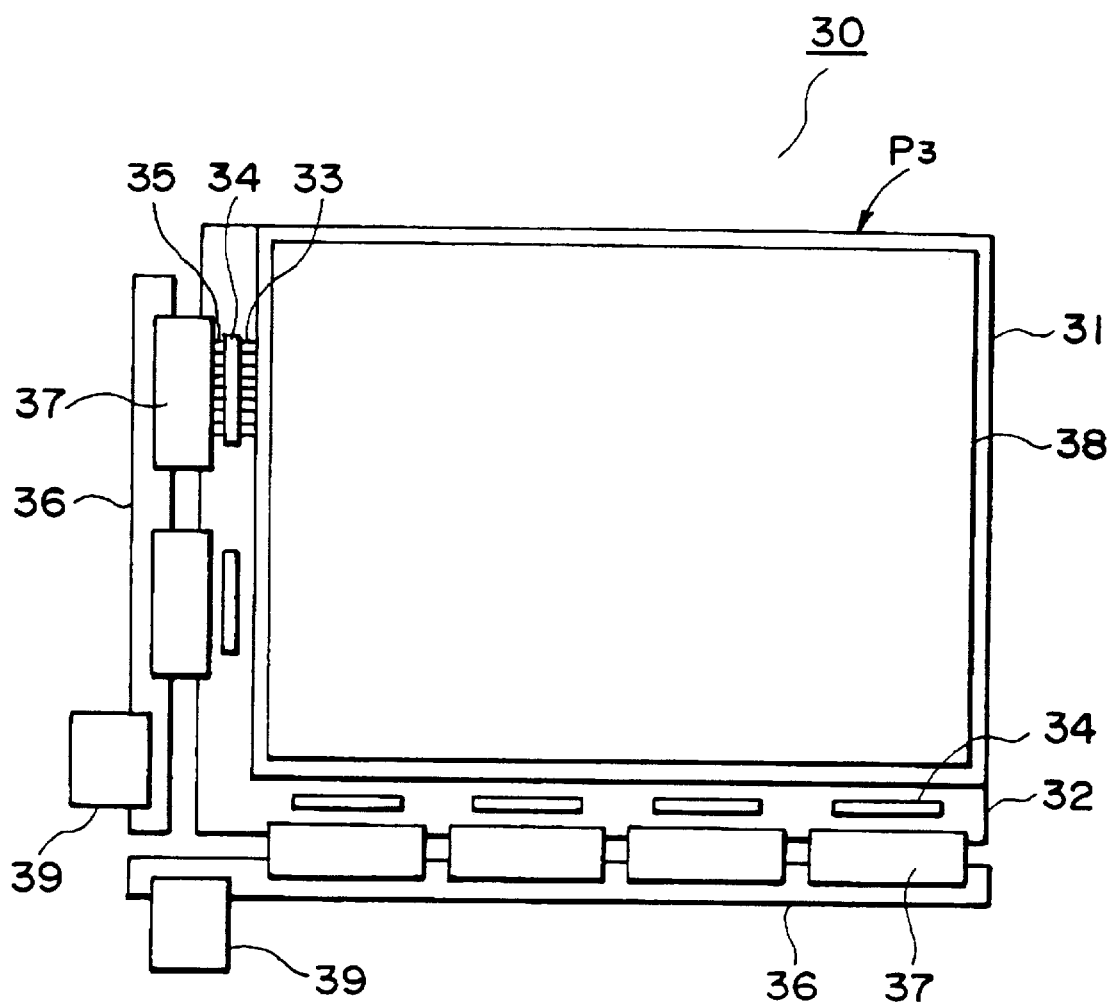
FIG. 4 is a schematic plan view of an embodiment of a structure of the liquid crystal apparatus according to the present invention.

FIG. 4 shows an embodiment of a liquid crystal apparatus 30 of the present invention.

The liquid crystal apparatus 30 includes a liquid crystal device (panel) P3 wherein a pair of substrates 31 and 32 at least one of which (first) electrodes 33 are disposed at a periphery the panel P3 (partially shown in the figure), sandwiched between a liquid crystal (not shown).

On the substrate 32, a plurality of driver devices 34 (e.g., driver ICs) are disposed (mounted) along and in proximity to a side of the substrate 32 so as to be electrically connected to the electrodes 33 and also (second) electrodes 34.

The liquid crystal apparatus 30 further includes a driver board 36 (e.g., a PCB), for supplying signals to the driver devices 34, disposed in parallel with and spaced apart from the side of the substrate where the driver devices 34 are arranged, and a plurality of connection sheets 37 (e.g., FPCs) disposed between the driver board 36 and the substrate 32 so that each of the driver devices 34 is electrically connected to the driver board 36 via the electrodes 35 by appropriately setting a size of each connection sheet 37 so as to correspond to that of each driver device (driver IC) 34 as shown in FIG. 4.

In the case where the driver devices 34 are driver ICs for the liquid crystal panel, each of the driver ICs 34 may generally be electrically connected with at least several hundred (output) electrodes 33 and ca. 50 (input) electrodes 35, respectively.

Figure 9:
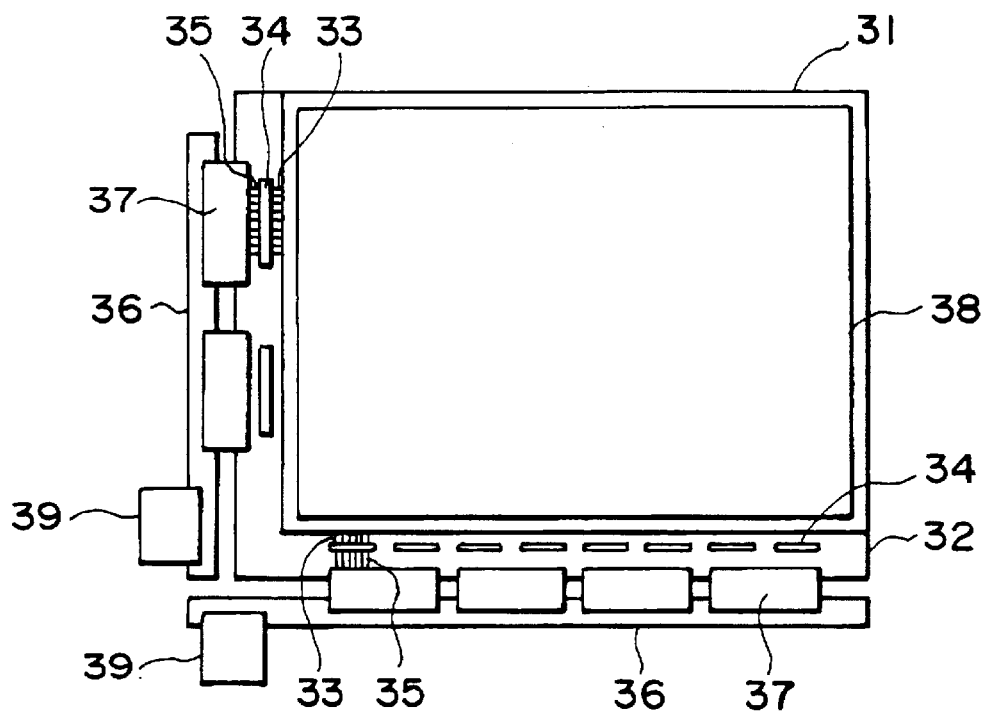
FIG. 9 is a schematic plan view of another embodiment of a structure of the liquid crystal apparatus of the present invention.

Each of the connection sheets 37 may be formed in a shape corresponding to adjacent (two) driver devices 34 as shown at a lower side of FIG. 9 and may also be formed so as to correspond to three or more driver devices 34 in the case where a large number of IC chips (as driver devices 34) of a small size are mounted on the substrate(s) of the liquid crystal apparatus. Such an electrical connection structure between plural driver devices 34 and each connections sheet 37 allows an efficient input signal supply from the driver board 36.

Figure 7A:
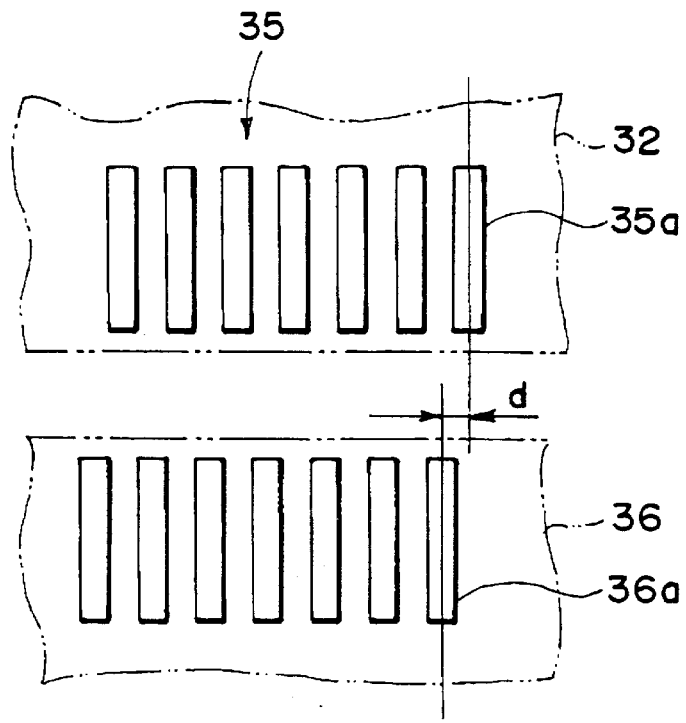
FIGS. 7A and 7B are schematic plan views for illustrating a (relative) positional relationship between respective electrodes of a (glass) substrate and a driver board or PCB (FIG. 7A) and between those of the substrate, the driver board and a connection sheet (disposed therebetween) (FIG. 7B) in the liquid crystal apparatus of the present invention.
Figure 7B:
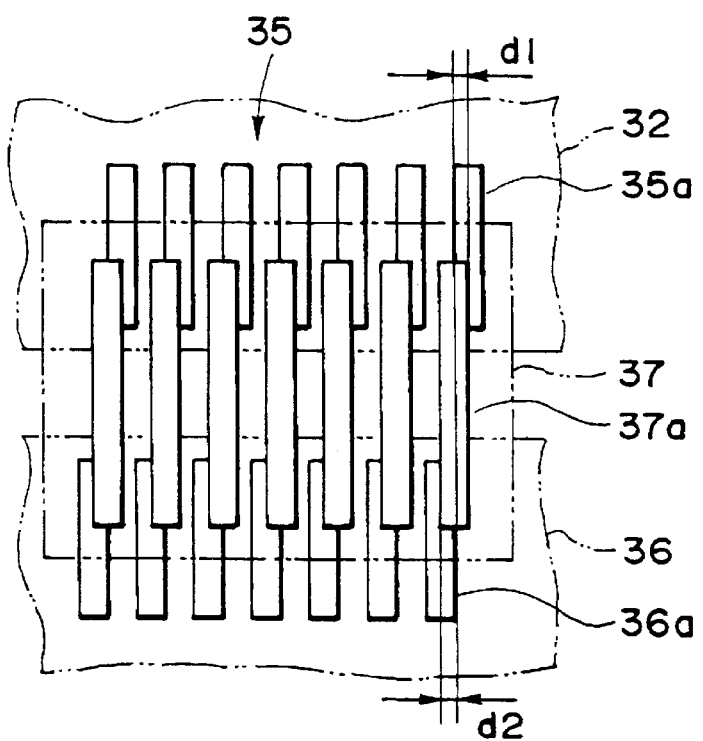

As specifically shown in FIGS. 7A and 7B, the (second) electrodes 35a disposed with a prescribed pitch. Similarly, on the driver board 36 and the connection sheet 37, stripe electrodes 36a and 37a are formed, respectively.

When the stripe electrodes 36a are positionally deviated by a spacing d from the opposite stripe electrodes 35a as shown in FIG. 7A, an electrical connection between the electrodes 35a and 36a are ensured by disposing (connection) electrodes 37a therebetween so as to overlap the electrodes 35a and 37a by widths d1 and d2, respectively, as shown in FIG. 7B.

Figure 8A:
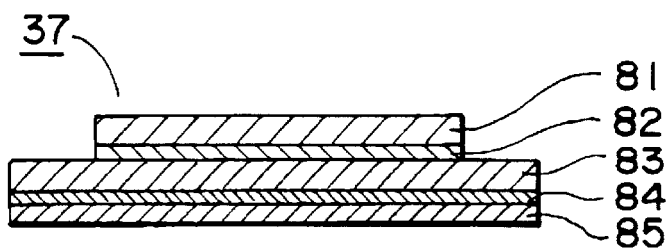
FIGS. 8A and 8B are schematic sectional views of embodiments of a connection sheet and a driver board used in the liquid crystal apparatus of the present invention, respectively.

The connection sheet 37 may, e.g., have a structure as shown in FIG. 8A wherein a copper foil 83 (as a conductive (electrode) layer) sandwiched between adhesive layers 82 and 84 is disposed on a base film 85 and covered with a covering film 81. The base film 85 may preferably be a flexible film (e.g., 15–75 µm-thick polyimide film) effective in alleviating a stress caused between the driver board 36 and the substrate 32. In this instance, the electrodes 37a may be formed through a photolithographic process.

Figure 8B:
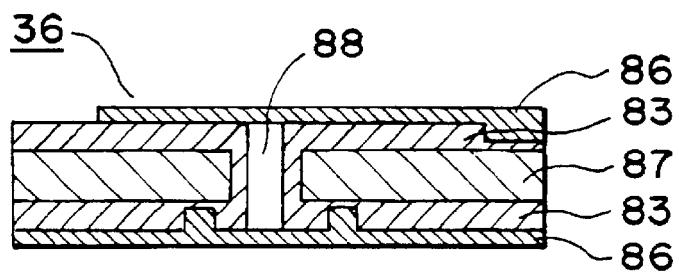

The driver board 36 may be a PCB having a plurality of laminated conductive layers (electrodes). FIG. 8B shows an example of the PCB. The PCB 36 includes two copper films 83 (conductive (electrode) layers) sandwiching an (electrically) insulating layer 87 and disposed between solder resist layers 86 through which a through-hole 88 is formed. The driver board 36 may be a FPC and may comprise a base material of ceramics or metals (e.g., Al).

The connection sheet 37 may be bonded to the substrate 32 and/or the driver board 36 by an anisotropic conductive adhesive having a property of both of an electroconductive properties in a thickness direction and insulating properties in a planar direction.

A specific example of the positional alignment of the stripe electrodes 35a, 36a and 37a will be described with reference to FIGS. 4, 7A and 7B.

On a glass substrate 32, twelve (12) ICs 34 are mounted and each electrically connected to 50 stripe electrodes 35a disposed on the substrate 32 with a width of 0.2 mm and a pitch of 0.4 mm. On a PCB (driver board) 36, 600 (50×12) stripe electrodes 36a each with a width of 0.2 mm and a pitch of 0.4 mm are formed and arranged so that each of the stripe electrodes 36a is opposite to and corresponds to that 35a on the substrate 32 side.

Between the substrate 22 and the PCB 36, 12 FPCs (connection sheets) 37 each provided with 50 stripe electrodes 37a each having a width of 0.2 mm and a pitch of 0.4 mm are disposed and arranged in opposed relationship with the respective ICs 34, whereby the respective electrodes 37a on the FPCs 37 are electrically connected with those 35a on the substrate 32 and those 36a on the PCB 36.

Specifically, when a distance between both terminal electrodes 36a on the PCB 36 is set to 340 mm and a dimensional error (tolerance) of an electrode pattern of the stripe electrodes 36a is ±0.05%, the resultant electrode pattern thereof becomes ±0.17 mm. In this regard, when the electrodes 36a on the PCB 36 are positionally aligned with the electrodes 35a on the substrate 32 at a positional (dimensional) accuracy of ±0.015 mm while the center electrodes of the electrodes 36a and 35a are precisely aligned with each other, at both the terminal portions, the (terminal) electrode 36a is positionally deviated from the corresponding (terminal) electrode 35a by a maximum (deviation) width d of ±0.1 mm (0.17/2+0.015) as shown in FIG. 7A.

In this instance, if the electrodes 37a are aligned with either one group of the electrodes 35a and 36a (e.g., the electrodes 36a), each of overlapping portions of the electrodes 37a with the electrodes 36a substantially has a width of 0.2 mm corresponding to the width of the electrodes 37a and 36a. However, those of the electrodes 37a with the electrodes 35a is considerably decreased, particularly becomes at most half of the electrode width at the terminal portions.

Accordingly, in this embodiment, as shown in FIG. 7E, the electrodes 37a are aligned with the electrodes 35a and the electrodes 37a so that overlapping portions between the electrodes 37a and 35a and those between the electrodes 37a and 36a have a substantially identical (overlapping) width (i.e., d1=d2) since a broader overlapping width of the electrodes provides a smaller electrical resistance and a better reliability in the case of bonding of the FPCs 37 to the glass substrate 32 and the PCB 36 with an anisotropic conductive adhesive.

As a result, even when the deviation width d between the electrodes 35a and 37a is 0.1 mm (FIG. 7A), each of the deviation widths d1 and d2 is decreased to half of the deviation with d1 (i.e., d1=d2=0.05 mm), thus sufficiently ensuring electrical connection (overlapping width) of the electrodes 35a, 37a and 36a (FIG. 7B).

When the above-mentioned liquid crystal device P3 is of a transmission-type, a backlight unit (device) 40 is disposed behind the liquid crystal device P3 as shown in FIGS. 5A–5D.

More specifically, by appropriately changing a shape of the connection sheets 37, the position of the driver board 36 relative to the driver devices 34 formed on the substrate 32 may be modified. FIG. 5A shows a position of the driver board 36 disposed along the side of the substrate 32 via flat-shaped connections sheets 37. FIG. 5B shows a driver board 36 position disposed opposite to the side surface of the backlight unit 40. FIG. 5C shows a driver board 36 position disposed on a back side of the substrate 32 opposite to the driver device 34-mounted side. FIG. 5D shows a driver board 36 position disposed behind the substrate 32 via the backlight unit 40. In these figures, the backlight unit 40 includes a linear light source 41 (e.g., a fluorescent lamp), thus being constituted as that of an edge-type. Such an edge-type backlight unit 40 may further include a light-guiding member as desired. The backlight unit 40 may be that provided with a light source disposed directly under the substrate 32.

An embodiment of the production process of a liquid crystal apparatus according to the present invention will be explained with reference to FIGS. 6, 7A and 7B.

First, a liquid crystal panel P3 provided with a plurality of driver devices 34 is prepared as described above (FIG. 6).

Figure 6:
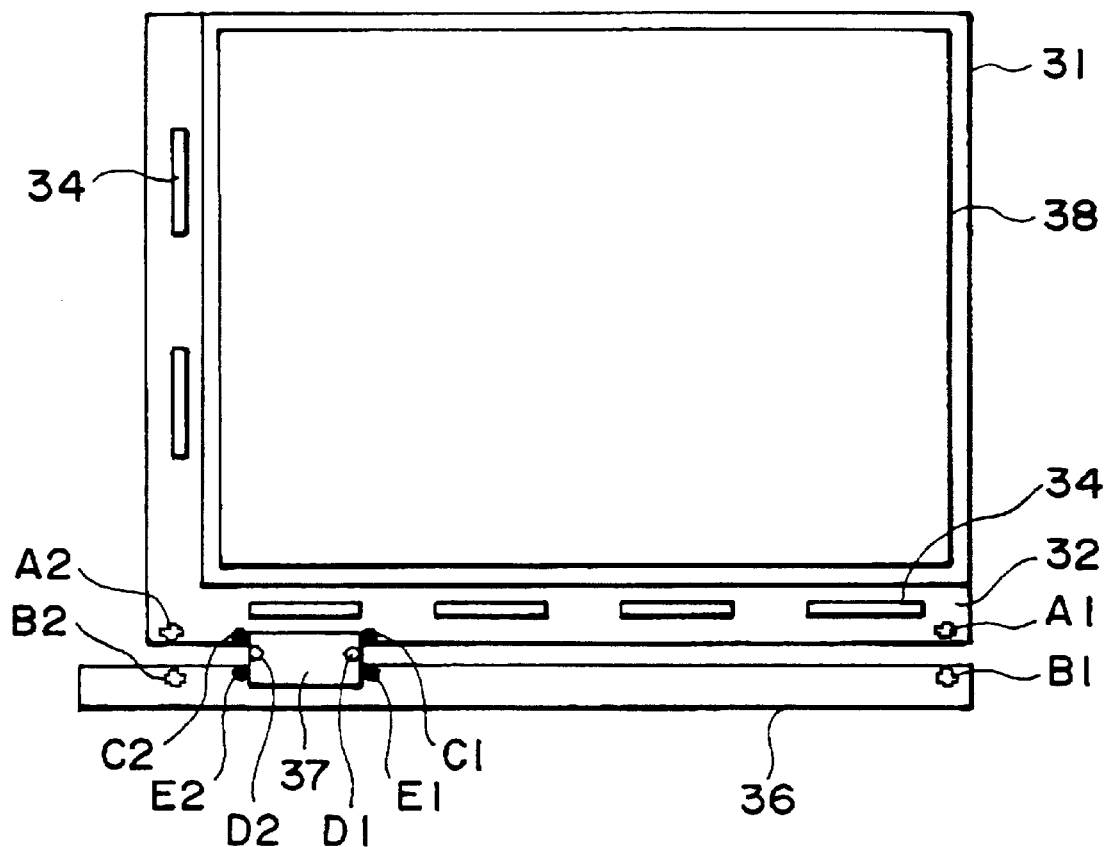
FIG. 6 is a schematic plan view for illustrating positions of alignment marks in the liquid crystal apparatus of the present invention.

A positional alignment of the substrate 32 with the driver board 36 may be performed so that each of the stripe electrodes 36a formed on the driver board 36 are opposite to a corresponding stripe electrode 35a formed on the substrate 35a by utilizing alignment marks A1, A2, B1 and B2 (FIG. 6 and FIG. 7A). The alignment marks A1, A2, B1 and B2 are provided to the substrate 32 (the alignment marks A1 and A2) and the driver board 36 (the alignment marks B1 and B2) in advance. The positional alignment of the substrate 32 with the driver board 36 is effected by confirming these alignment marks (A1, A2, B1 and B2) with, e.g., a camera or by confirming the electrode patterns of the electrodes 35a and 36a with, e.g., a camera.

Thereafter, positional alignments of the connection sheets 37 with the driver board 36 and the substrate 32 may be similarly performed so that each of the stripe electrodes 37a formed on the connection sheet 37 are electrically connected to a corresponding (opposite) stripe electrode 36a (on the driver board 36) and a corresponding (opposite) stripe electrode 35a (on the substrate 32), respectively, by using alignment marks C1, C2, D1, D2, E1 and E2 or electrode patterns of these electrodes 37a, 36a and 35a (FIG. 6 and FIG. 7B). Specifically, the connection sheet 37 may be positionally aligned with the driver board 36 by using the alignment marks D1, D2 and E1 and E2 or the electrode patterns of the electrodes 37a and 35a.

In these instances, the camera for confirming the alignment marks may be disposed over and opposite to the alignment marks but may be disposed below the alignment marks when a transparent substrate 32 and a transparent driver board 37 are used to allow a confirmation of the alignment marks through these substrates 32 and 37. Further, when an opaque (non-light transmissive) substrate 32 is used, the alignment marks D1 and D2 are required to be formed on the connection sheet 37 at a portion not overlapping the substrate 32 and a camera is disposed behind the liquid crystal device P3. When the transparent substrate 32 is used, the confirmation of the alignment marks D1 and D2 may be effected via the substrate 32, thus allowing the formation of the alignment marks D1 and D2 at a portion overlapping the substrate 32.

According to the above-mentioned embodiments of the liquid crystal apparatus (and the production process thereof) of the present invention, the driver devices 34 mounted on the substrate 32 (constituting the liquid crystal device P3) are electrically connected to the driver board 36 via the connection sheets 37 and the (second) electrodes 35, so that driving signals are transmitted (supplied) to the (first) electrodes 33 via the driver board 36, the connection sheets 37, the electrodes 35 and the driver devices 34, thereby to drive the liquid crystal device P3.

Further, even when an electrode 36a on the driver board 36-side is deviated from a normal position (where it is properly opposite to (in alignment with) a corresponding electrode 35a on the substrate 32-side) by a deviation width d (a spacing between center lines of the electrodes 35a and 36a) as shown in FIG. 7A, it is possible to ensure the electrode pattern between the electrodes 35a and 36a via (connection) electrodes 37a by disposing the electrodes 37a so that a deviation width d1 between the electrodes 35a and 37a is set within the electrode width of the electrode 37a and a deviation width d2 between the electrodes 36a and 37a is also set within the electrode 37a width. As a result, all the oppositely disposed electrodes 36a and 37a are electrically connected to each other and those 35a and 37a are also electrically connected to each other, thus sufficiently ensuring electrical connection of the driver board 36, the connection sheets 37 and the electrodes 35 to improve a production yield of a resultant liquid crystal apparatus, particularly in a mass-production thereof.

Further, the above-mentioned liquid crystal apparatus allows the use of a longer driver board 36 liable to cause a larger dimensional error. As a result, it becomes possible to produce a liquid crystal apparatus of a large picture area, a high resolution and being capable of allowing motion picture image display.

Hereinbelow, the present invention will be described more specifically based on a specific example.

A liquid crystal apparatus 30 including a liquid crystal panel P3 (display region (17 in.)=length (L)×width (W)= 345×259 mm; 1600×1200 pixels) as shown in FIG. 4 was prepared in the following manner.

On two glass substrates (L×W×T(thickness)=350×265×1 mm) 31 and (L×W×T=355×270×1 mm) 32, 1200 ITO (indium tin oxide) scanning electrodes (width (W)=100 μm, pitch (P)=216 μm) and 4800 (1600×3) ITO data electrodes (W=30 μm, P=72 μm) were formed and elongated to portions in the vicinity of two sides of the substrate 32, respectively (e.g., stripe electrodes 33 as partially shown in FIG. 4) when the substrates 31 and 32 were applied to each other Fach of the stripe electrodes 33 at the portions had P=200 μm for the scanning electrodes and P=60 μm for the data electrodes. Further, each of the ITO scanning and data electrodes had a thickness of 700 Å and was partially coated with a 1500 Å-thick Al-based metal.

Between the glass substrates 31 and 32, a liquid crystal was disposed.

A plurality of driver ICs (driver devices) 34 were mounted on the respective glass substrate 32 at a periphery thereof so as to be electrically connected with the electrodes 33 as shown in FIG. 4. Specifically, 12 driver ICs 34 (L=20 mm, W=2.5 mm, T=0.6 mm, output=400 lines at P=60 μm) were provided at one of two longer sides of the substrate 32 and 16 driver ICs 34 (L=20 mm, W=3.0 mm, T=0.6 mm, output=200 lines at P=200 μm) were provided at one shorter side of the substrate 32.

At the periphery of the substrates 31 and 32, ITO intermediate (connection) electrodes 35 (35a in FIGS. 7A and 7B) of a material identical to that of the scanning the data electrodes were formed and electrically connected with the corresponding driver ICs 34 at 50 lines/one IC, respectively. The width and pitch of each of the electrodes 35 were set to be 0.2 μm and 0.4 μm, respectively.

To the outer surfaces of the substrates 31 and 32 a pair of polarizers 38 were attached, thus preparing a liquid crystal panel P3.

Two driver boards (PCBs ) 36 (L×W×T=250×20×1.0 mm for the scanning electrode-side, L×W×T=360×15×1.0 mm for the date electrode-side) each including 42 μm-thick stripe electrodes 36a (W=0.2 mm, P=0.4 mm) of Cu foil coated with Ni and Au layers and having a structure as shown in FIG. 8B (as described above) but having 4 or 6 conductive layers were disposed in parallel with and spaced apart from the driver IC-mounted side of the substrate 32, respectively (as shown in FIG. 4).

As connection sheets 37, a plurality (18 in total=12+6) of FPCs (L×W×T=25×10×0.12 mm) having a structure as shown in FIG. 8A (as described above) were used and disposed between the substrate 32 (31) and the PCBs 36 so that each FPC 37 corresponded to one driver IC 34. Each of the FPCs included a 25 μm-thick flexible film (tape) of polyimide (as a base film), 50 stripe electrodes 37a each of 18 μm-thick Cu foil (W=0.2 mm, P=0.4 mm) formed on the flexible film via an adhesive layer, a 25 μm-thick soft polyimide film formed on the electrodes 37a via an adhesive layer. The flexible film had at least one 1.2 mm-wide slit portion where the electrodes 37a were coated with a 30–70 μm-thick soft polyimide film, thus allowing a folding operation of the FPC 37 thereat.

The PCBs (driver boards) 36 were connected to a control circuit (not shown) via FFCs 39.

Electrical connections of the PCB 36 and FPC 37 and of the FPC 37 and the substrate 32 (31) were performed by using an anisotropic conductive adhesive and alignment marks in the following manner.

At connecting (bonding) portions of the substrate 32 (31), the FPCs 37 and the PCBs 36, an anisotropic conductive adhesive was disposed in advance.

Further, alignment marks A1, A2, B1, B2, C1, C2, D1, D2, E1 and E2 were formed as shown in FIG. 6.

Specifically, the alignment marks A1 and A2 were formed on the corners of the substrate 32 (31) and on the PCB 36, the alignment marks B1 and B2 were formed opposite to the alignment marks A1 and A2, respectively. The alignment marks C1 and C2 were formed on the substrate 32 (31) in the vicinity of a portion where the FPC 37 was connected and on the PCB 36, the alignment marks E1 and E2 were formed opposite to the alignment marks C1 and C2, respectively. Further, on the back side of the FPC 37, the alignment marks D1 and D2 were formed.

A positional alignment of the PCB 36 with the substrate 32 was performed by confirming the alignment marks A1, A2, B1 and B2 through a camera. In this state, when a relative positional deviation between the PCB 36 and the substrate 32 (a difference (e.g., d) in position between the outermost electrodes 35a and 36a in FIG. 7A) was observed, the position of the PCB 36 was shifted in accordance with a degree (amount) of the deviation which was assumed by calculating a difference in position between the two electrodes concerned depending on the mounting positions of the respective FPCs 37 after effecting the positional alignment by confirming the alignment marks D1, D2, C1 and C2.

Thereafter, by confirming the alignment marks D1, D2, C1, C2, E1 and E2, the positional alignment of the FPC 37 with the glass substrate 32 and the PCB 36, followed by two-step thermo compression bonding with a 1.5 mm-wide heating (and pressing) head under conditions including: 120° C., 10 kgf/cm$^2$, 2 sec (for 1st step) and 180° C., 30 kgf/cm$^2$, 15 sec (for 2nd step), thus completing the bonding of the FPC 37 to the glass substrate 32 and the PCB 36 to prepare a liquid crystal apparatus according to the present invention.

According to this specific example, it was possible to achieve a good electrical connection state between the electrodes 36a of the PCBs 36 and the electrodes 35a on the liquid crystal panel-side via the electrodes 37a of the FPCs 37.

As described hereinabove, according to the present invention, even when electrodes on the PCB (driver board)-side are deviated from a normal position (e.g., they fail to retain an opposed (positional) relationship with those on the substrate (panel)-side), it is possible to sufficiently ensure electrical connection of the electrodes or the driver board-side with those on the panel-side via electrodes on the FPC (connection sheet)-side by disposing a plurality of FPCs (connection sheets) between the driver board and the substrate so that the electrodes on the connection sheet-side are electrically connected to corresponding (opposite) electrodes on the driver board-side, respectively, and to those on the panel side, respectively.

As a result it is possible to enhance a production yield particularly in a mass-production of a liquid crystal apparatus. It also becomes possible to produce a large-size liquid crystal apparatus including a longer driver board liable to induce a production error in electrode position. Further, it is possible to provide a liquid crystal apparatus of a high resolution and allowing a motion picture image display.

What is claimed is:

1. A liquid crystal apparatus, comprising:
   a liquid crystal device including a pair of substrates at least one of which is provided with first electrodes, and a liquid crystal disposed between the substrates,
   a plurality of driver devices disposed on said at least one substrate at a periphery thereof and electrically connected to the first electrodes,
   a driver board for supplying signals to the driver devices, disposed in parallel with the driver devices,
   second electrodes disposed on said at least one substrate and electrically connected to the driver devices, and
   a plurality of connection sheets disposed between the driver board and said at least one substrate and each electrically connecting each of the driver devices to the driver board via the second electrodes, whereby
   the first electrodes are supplied with driving signals for driving the liquid crystal device via the driver board, the connection sheets, the second electrodes and the driver devices, wherein
   the second electrodes comprise a plurality of stripe electrodes; the driver board is provided with a plurality of stripe electrodes; and each connection sheet is provided with a plurality of stripe electrodes each having a prescribed width and spaced apart from each other with a prescribed spacing therebetween, each stripe electrode of the connection sheet being disposed between and electrically connected to a corresponding stripe electrode of the driver board and a corresponding one of the second electrodes, respectively.

2. An apparatus according to claim 1, wherein each stripe electrode of the driver board and a corresponding one of the second electrodes have a deviation width defined by a spacing between center lines of said stripe electrode and said corresponding one of the second electrodes, said deviation width being within said prescribed width of a corresponding stripe electrode of the connection sheets.

3. An apparatus according to claim 1, wherein each of the connection sheets has a structure including a single conductive layer, and the driver board has a structure including at least two conductive layers.

4. An apparatus according to claim 1, wherein each of the connection sheets comprises a flexible sheet and electrodes formed on the flexible sheets.

5. An apparatus according to any one of claims 1, 3 or 4, wherein the connection sheets are bonded to the substrate and the driver board, respectively, with an anisotropic conductive adhesive showing electroconductive properties in a thickness direction and insulating properties in a planar direction.

6. A process for producing a liquid crystal apparatus according to claim 1, comprising the steps of:
   forming a plurality of said second electrodes on said at least one substrate so as to be electrically connected to the plurality of said driver devices,
   positionally aligning the driver board with said at least one substrate so that the stripe electrodes of the driver board and the stripe electrodes of the second electrodes of said at least one substrate are in an opposed relationship,
   electrically connecting each of the stripe electrodes of each of the connection sheets to a corresponding stripe electrode opposite thereto of the driver board, and
   electrically connecting each of the stripe electrodes of each of the connection sheets to a corresponding stripe electrode opposite thereto of the second electrodes, thereby to ensure electrical connection between each of the driver devices and the driver board via the second electrodes and the connection sheets.

7. A process according to claim 6, wherein the step of positional alignment of the driver board with said at least one substrate is performed by means of alignment marks provided to the board and substrate; the step of electrical connection between the electrodes of the connection sheets and those of the driver board is performed by means of alignment marks provided to the sheets and board; and the step of electrical connection between the electrodes of the connection sheets and the second electrodes of said at least one substrate is performed by means of alignment marks provided to the sheets and substrate.

* * * * *

UNITED STATES PATENT AND TRADEMARK OFFICE
CERTIFICATE OF CORRECTION

PATENT NO. : 6,266,119 B1
DATED : July 24, 2001
INVENTOR(S) : Masanori Takahashi et al.

It is certified that error appears in the above-identified patent and that said Letters Patent is hereby corrected as shown below:

<u>Column 1,</u>
Line 43, "rigid" should read -- rigidly --; and
Line 52, "without using the above-mentioned" should be deleted.

<u>Column 2,</u>
Line 22, "further" should read -- even --;
Line 33, "a" should read -- ca. --; and
Line 35, "s" should read -- is --.

<u>Column 4,</u>
Line 10, "arc" should read -- are --;
Line 35, "periphery" should read -- periphery of --; and
Line 65, "connections" should read -- connection --.

<u>Column 5,</u>
Line 30, "an" should be deleted.

<u>Column 6,</u>
Line 5, "is" should read -- are --;
Line 6, "becomes" should read -- become --; and
Line 8, "FIG. 7E," should read -- FIG. 7B, --.

<u>Column 7,</u>
Line 1, "are" should read -- is --; and
Line 38, "aligrnuent" should read -- alignment --.

UNITED STATES PATENT AND TRADEMARK OFFICE
CERTIFICATE OF CORRECTION

PATENT NO.    : 6,266,119 B1
DATED         : July 24, 2001
INVENTOR(S)   : Masanori Takahashi et al.

It is certified that error appears in the above-identified patent and that said Letters Patent is hereby corrected as shown below:

Column 8,
Line 9, "other Fach" should read -- other. Each --;
Line 37, "date" should read -- data --; and
Line 55, "wherc" should read -- where --.

Column 19,
Line 28, "theremo compression" should read -- theremocompression --.

Signed and Sealed this

Second Day of April, 2002

Attest:

JAMES E. ROGAN
Attesting Officer     Director of the United States Patent and Trademark Office